United States Patent [19]

Sakai

[11] Patent Number: 5,304,511
[45] Date of Patent: Apr. 19, 1994

[54] PRODUCTION METHOD OF T-SHAPED GATE ELECTRODE IN SEMICONDUCTOR DEVICE

[75] Inventor: Masayuki Sakai, Itami, Japan

[73] Assignee: Mitsubishi Denki Kabushiki Kaisha, Tokyo, Japan

[21] Appl. No.: 28,115

[22] Filed: Mar. 9, 1993

[30] Foreign Application Priority Data

Sep. 29, 1992 [JP] Japan .................................. 4-285006

[51] Int. Cl.$^5$ ............................................ H01L 21/44
[52] U.S. Cl. ................................... 437/203; 437/912; 437/228; 437/944; 257/283
[58] Field of Search .................. 257/283, 284; 437/228, 437/229, 944, 203, 187, 912; 148/DIG. 100; 156/644

[56] References Cited

U.S. PATENT DOCUMENTS

| | | | |
|---|---|---|---|
| 5,006,478 | 4/1991 | Kobayashi et al. | 437/41 |
| 5,032,541 | 7/1991 | Sakamoto et al. | 437/203 |
| 5,240,878 | 8/1993 | Fitzsimmons et al. | 437/187 |

FOREIGN PATENT DOCUMENTS 1-243476  9/1989  Japan.
3-278543 12/1991  Japan.
3-289142 12/1991  Japan.

*Primary Examiner*—George Fourson
*Assistant Examiner*—David Mason
*Attorney, Agent, or Firm*—Leydig, Voit & Mayer

[57] ABSTRACT

A method for producing a T-shaped gate electrode of a semiconductor device including forming an insulating film on a semiconductor substrate, etching away a prescribed region of the insulating film, depositing a metal film having a prescribed thickness, forming a first photoresist film and removing the photoresist film except where the insulating film has been removed, forming a second photoresist film, patterning the second photoresist film to expose the metal film along a sidewall of the insulating film, etching away a portion of the metal film using the first and second photoresist films as a mask, depositing a gate metal and removing the first and second photoresist films and overlying gate metal by lift-off, and etching away the metal films remaining on the semiconductor substrate and the insulating film. Thereby, a T-shaped gate electrode with shortened length is formed.

6 Claims, 2 Drawing Sheets

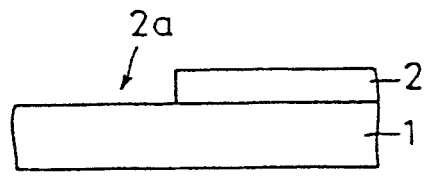
FIG.I(a)
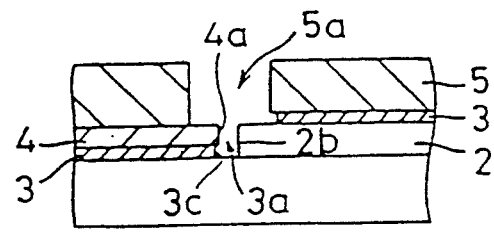
FIG.I(e)
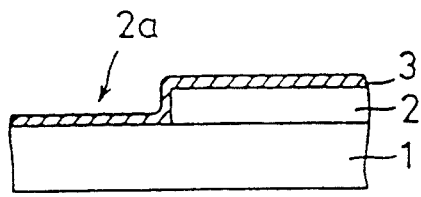
FIG.I(b)
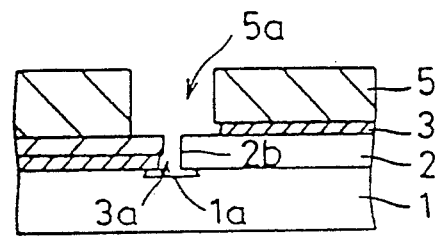
FIG.I(f)
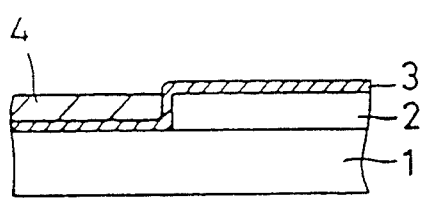
FIG.I(c)
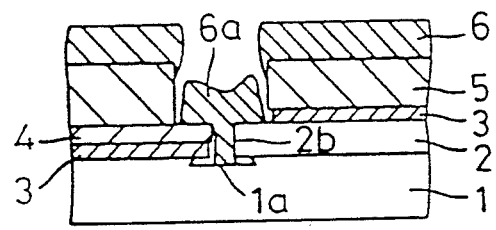
FIG.I(g)
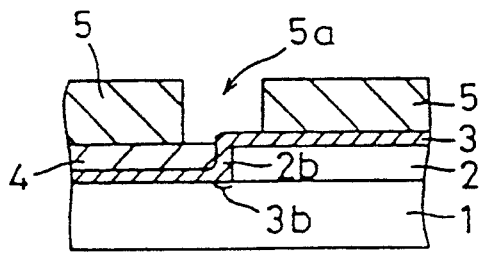
FIG.I(d)
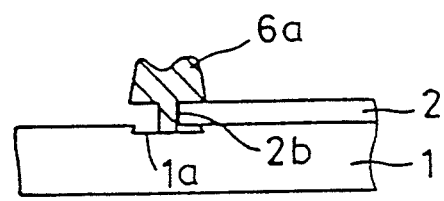
FIG.I(h)

PRODUCTION METHOD OF T-SHAPED GATE ELECTRODE IN SEMICONDUCTOR DEVICE

FIELD OF THE INVENTION

The present invention relates to a production method of a T-shaped gate electrode in a semiconductor device of reduced gate length.

BACKGROUND OF THE INVENTIONS

FIGS. 2(a) to 2(f) are cross sections illustrating process steps in a method of producing a T-shaped gate electrode of a prior art semiconductor device. In the figures, reference numeral 1 designates a compound semiconductor substrate, numeral 1a designates a recess, numeral 2 designates an insulating film, numeral 6 designates a gate metal, numeral 6a designates a T-shaped gate electrode, numeral 7 designates a photoresist film sensitive to electron beam exposure, numeral 8 designates a photoresist film sensitive to light exposure and numerals 7a and 8a designate apertures.

A description is given of process steps of a T-shaped gate electrode with reference to FIGS. 2(a) to 2(f).

First, as illustrated in FIG. 2(a), a photoresist 7 for electron beam exposure has deposited on it a photoresist 8 for optical exposure. The photoresist 7 is disposed on a compound semiconductor substrate 1. During the deposition, the photoresist 7 for electron beam exposure and the photoresist 8 for optical exposure must not mix with each other, namely, the electron beam photoresist resin must not be dissolved by the solvent of the optical photoresist 8. Therefore, photoresists comprising resin and solvents satisfying the above-described condition, are selected as the electron beam photoresist and the optical photoresist. Secondly, by a predetermined exposure of the photoresist film 8 in an optical exposure apparatus and development of the film in a prescribed developer, as illustrated in FIG. 2(b), a first aperture 8a of a relatively large width is formed in the optical photoresist film 8. Thirdly, by electron beam exposure of a prescribed portion of the electron beam photoresist film 7 in an electron beam exposure apparatus through this first aperture 8a, and development of the film in a prescribed developer, as illustrated in FIG. 2(c), a second aperture 7a of a relatively small width is formed. Next, as illustrated in FIG. 2(d), using the photoresist films 8 and 7 in which the first aperture 8a and the second aperture 7a are respectively formed as a mask, a recess 1a is formed by etching the compound semiconductor substrate 1. Then, as illustrated in FIG. 2(e), a gate metal 6 is deposited on the whole surface of the substrate and lift off is conducted to form a T-shaped gate electrode 6a as illustrated in FIG. 2(f).

As described above, in the prior art method of forming a T-shaped gate electrode, by electron beam exposure of the electron beam photoresist film 7 and development of the film, the photoresist aperture pattern for prescribing the lower part electrode width of the T-shape gate electrode (gate length) is produced. In this pattern exposure method employing electron beam irradiation, in drawing patterns, it is difficult to enhance throughput in manufacturing semiconductor devices.

Further, in the prior art process, in order to produce the T-shaped gate electrode with improved precision and stability, when the photoresist aperture pattern for prescribing the upper part electrode width of the T-shaped gate electrode is produced, namely, when the optical photoresist film 8 is developed, it is necessary that the electron beam photoresist film 7 below the photoresist film 8 not be developed by the developer of the film 8. In addition, as described above, when the photoresist film 8 is deposited on the photoresist film 7, these films are required not to mix with each other. Therefore, the degree of freedom in selecting photoresist materials is unfavorably restricted to a great extent.

In addition, in the pattern exposure method with electron beam irradiation, i.e., direct drawing method, at present, the resolution limit is at most 0.2 to 0.25 microns and the gate length is not shortened below that limit.

SUMMARY OF THE INVENTION

It is an object of the present invention to provide a production method of a T-shaped gate electrode in which gate length is shortened efficiently without employing a direct drawing method such as electron beam exposure and the degree of freedom in selecting photoresist materials is increased.

It is another object of the present invention to provide a production method that produces efficiently a T-shaped gate electrode having a gate length shortened to below 0.2 microns.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

In a method producing a T-shaped gate electrode of semiconductor device in accordance with the present invention, after forming an insulating film of which a sidewall becomes a sidewall of an aperture of a mask prescribing the lower part of the T-shaped gate electrode (gate length) when a gate metal is deposited, and depositing a metal film along the sidewall of the insulating film, an aperture of the mask is obtained by etching away this metal film. Therefore, gate length is controlled just by adjusting the thickness of the metal film in depositing the metal film, resulting in shortening the gate length easily and efficiently. In addition, since the metal film is easily formed so that its thickness is below 0.2 microns, the gate length is shortened to below 0.2 microns. Further, since pattern production by electron beam irradiation is not required contrary to the prior art device, throughput in manufacturing semiconductor devices is enhanced. Since there is no necessity to laminate an electron beam photoresist and an optical photoresist, the degree of freedom in selecting materials of photoresist is increased.

BRIEF DESCRIPTION OF THE DRAWINGS

FIGS. 1(a) to 1(h) are cross sections illustrating process steps in a method for producing a T-shaped gate electrode in accordance with an embodiment of the present invention.

DETAILED DESCRIPTION OF THE PREFERRED EMBODIMENT

Figure 2A:
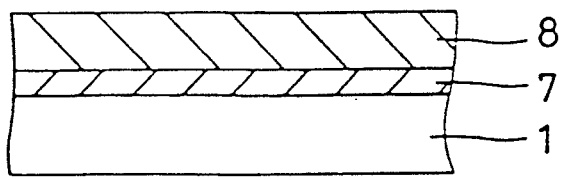
FIGS. 2(a) to 2(f) are cross sections illustrating process steps in a prior art method for producing a T-shaped gate electrode.

An embodiment of the present invention will be described in detail with reference to the drawing.

Figure 2B:
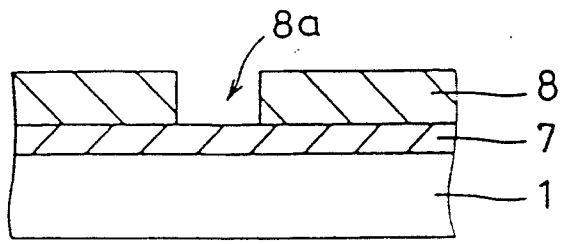
Figure 2C:
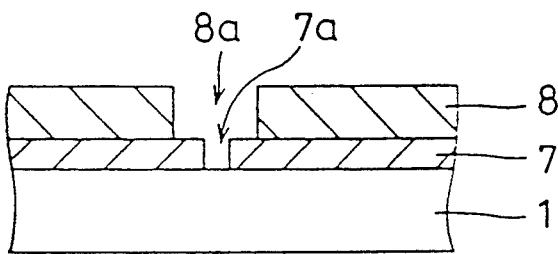
Figure 2D:
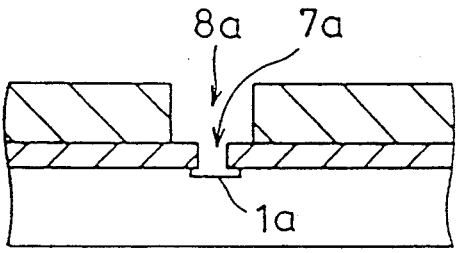
Figure 2E:
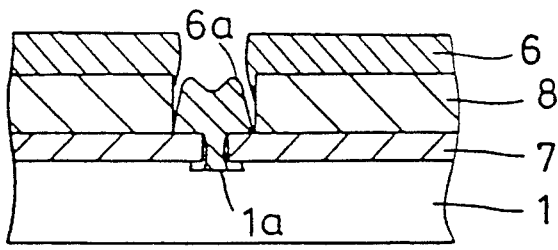
Figure 2F:
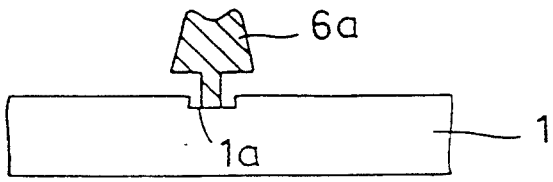

FIGS. 1(a) to 1(h) are cross sections illustrating process steps in a method for producing a T-shaped gate electrode in accordance with an embodiment of the present invention. In the figures, the same reference numerals as those of FIGS. 2(a) to 2(f) designate the same or corresponding parts. Reference numeral 2 designates an insulating film, numeral 2a designates an aperture, numeral 2b designates a sidewall of the insulating film 2, numeral 3 designates a WSi (tungsten silicide) film, numeral 3a designates an aperture, numeral 3b designates a WSi film formed along the sidewall 2b of the insulating film 2, numeral 3c designates a sidewall of the WSi film 3, numeral 4 designates a photoresist film, numeral 4a designates a sidewall of the photoresist film 4, numeral 5 designates a photoresist aperture pattern and numeral 5a designates an aperture.

A description is given of the process steps of forming a T-shaped gate electrode with reference to FIGS. 1(a) to 1(h).

First, as illustrated in FIG. 1(a), an insulating film 2, for example, comprising $SiO_2$ about 5000 Å thick is deposited on the compound semiconductor substrate 1 comprising GaAs or InP with a plasma CVD method or the like. And, by etching a prescribed portion of the insulating film 2, an aperture 2a is produced so that its end is disposed in a region where the gate electrode is to be produced. Secondly, as illustrated in FIG. 1(b), a WSi film 3 is deposited on the entire surface of the wafer by sputtering or a CVD method so that its thickness is a little under 0.2 microns. Thirdly, after forming a photoresist film with the aperture 2a buried by applying photoresist on the entire surface of the wafer, as illustrated in FIG. 1(c), the photoresist film is etched employing $O_2$ plasma reactive ion etching so that the photoresist film 4 remains in the aperture 2a. Next, as illustrated in FIG. 1(d), in a conventional photolithography technique, namely, a photolithography technique including a pattern exposure process employing an optical exposure apparatus, a photoresist aperture pattern 5 including an aperture 5a is formed. The width of the aperture 5a is approximately 1 micron so that a central portion of the aperture 5a prescribes the upper electrode width of the T-shaped gate electrode which is formed in a later process. Then, as illustrated in FIG. 1(e), using the photoresist aperture pattern 5 and the photoresist film 4 as a mask, the WSi film 3 (3b) is etched until the surface of the compound semiconductor substrate 1 is exposed, by plasma etching employing a mixture of $CF_4$ (tetrafluoromethane) and $O_2$, so that an aperture 3a is produced. The aperture 3a prescribes the lower electrode width of the T-shaped gate electrode formed in a later process, namely, a gate length, from the sidewall 2b of the insulating film 2 to a sidewall 4a of the photoresist film 4 and a sidewall 3c of the WSi film 3 which remains under the photoresist film 4, and is not etched. Further, as illustrated in FIG. 1(f), by recess-etching the compound semiconductor substrate 1 using the photoresist film 4 and the insulating film 2 exposed in the above-described process as a mask, the recess 1a is formed. Next, as illustrated in FIG. 1(g), by depositing a gate metal 6 formed by laminating a gold layer on a titanium layer or the like, on the entire surface of the wafer, a T-shaped gate electrode 6a is formed in contact with the bottom surface of the recess 1a. Then, the unnecessary gate metal 6, the photoresist aperture pattern 5 and the photoresist film 4 are removed by lift off. Next, by removing the remaining WSi film 3 by reactive ion etching employing a mixture of $CF_4$ and $O_2$ or a mixture of $CH_2F_2$ (difluoromethane) and $SF_6$ (hexafluorosulfur) as illustrated in FIG. 1(g), a gate electrode structure is obtained where the T-shaped gate electrode 6a has a gate length shortened below 0.2 microns in the recess 1a of the compound semiconductor substrate 1.

In this process steps of the embodiment, when forming the T-shaped gate electrode 6a by depositing the gate metal 6, the width of the aperture 3a of a mask prescribing the gate length depends on the thickness of the WSi film 3 disposed along the sidewall 2a of the insulating film 2 on the compound semiconductor substrate 1, which becomes a sidewall of the aperture 3a of the mask. Therefore, when the WSi film 3 is deposited on the entire surface of the wafer, just controlling its thickness enables the gate length to be shortened easily. In addition, since the thickness of the WSi film 3 deposited is reduced to below 0.2 microns, the gate length is shortened to under 0.2 microns. Further, in this process, since a pattern exposure process with electron beam irradiation is not required contrary to the prior art device, throughput in manufacturing semiconductor devices is enhanced in comparison with the prior art device. Further, in this process, since the photoresist aperture pattern 5 is formed in a conventional photolithography technique, namely, a photolithography technique including a pattern exposure process employing an optical exposure apparatus, and the photoresist film 4 is just employed as a mask in etching the WSi film 3, even if photoresists comprising materials which mix with each other are employed as the photoresists of the photoresist film 4 and the photoresist aperture pattern 5, these photoresists do not adversely influence the controllability of forming the electrode. As a result, the degree of freedom in selecting photoresist materials is enhanced and process steps of producing a gate electrode have few restrictions caused by the selection of materials.

While WSi film 3 is deposited as a metal film, a film comprising other refractory metals can be employed with the same effects as described above.

What is claimed is:

1. A method for producing a T-shaped gate electrode of a semiconductor device comprising:

forming an insulating film on a semiconductor substrate and forming a first aperture by etching away a prescribed region of said insulating film which exposes part of said semiconductor substrate and leaving a sidewall of said insulating film transverse to said semiconductor substrate;

depositing a thin metal film having a prescribed thickness on said semiconductor substrate and said insulating film including the sidewall;

forming a first photoresist film on all of said thin metal film and removing a portion of said photoresist film, leaving a portion of said first photoresist film in the first aperture;

forming a second photoresist film on the remaining portion of said first photoresist film and said thin metal film and patterning said second photoresist film to form a second aperture exposing part of said thin metal film and the first photoresist film in the first aperture at the sidewall of said insulating film;

etching away said metal film at and adjacent to the sidewall of said insulating film using said first and second photoresist films as a mask to expose a portion of said semiconductor substrate;

depositing a gate metal on said semiconductor substrate, said first and second photoresist films, and said insulating film and removing said first and second photoresist films and said gate metal disposed on said second photoresist film by lift-off; and etching away portions of said thin metal film remaining on said semiconductor substrate and said insulating film, leaving a T-shaped gate electrode.

2. The method for producing the T-shaped gate electrode of claim 1, wherein said metal film has a thickness less than 0.2 microns.

3. The method for producing the T-shaped gate electrode of claim 1, wherein said thin metal film is a comprising film deposited by one of sputtering and CVD.

4. The method for producing the T-shaped gate electrode of claim 2, wherein said thin metal film is a comprising film deposited by one of sputtering and CVD.

5. The method for producing the T-shaped gate electrode of claim 3, wherein said thin metal film comprising WSi film is etched away by plasma etching employing a mixture of $CF_4$ (tetrafluoromethane) and $O_2$.

6. The method for producing the T-shaped gate electrode of claim 4, wherein said thin metal film comprising WSi film is etched away by plasma etching employing a mixture of $CF_4$ (tetrafluoromethane) and $O_2$.

* * * * *